United States Patent [19]

Swagerty et al.

[11] 4,418,318

[45] Nov. 29, 1983

[54] DIGITAL PHASE-LOCKED LOOP CIRCUIT

[75] Inventors: Arnold Swagerty, Vienna, Va.; William A. Mitchell, Fairplay, Md.

[73] Assignee: Frederick Electronics Corporation, Frederick, Md.

[21] Appl. No.: 242,245

[22] Filed: Mar. 10, 1981

[51] Int. Cl.³ .............................................. H03L 7/08
[52] U.S. Cl. .................................... 328/155; 364/715; 375/120; 331/1 A; 331/25
[58] Field of Search ................ 328/155; 364/484, 569, 364/715, 724; 375/81, 120; 331/1 A, 25

[56] References Cited

U.S. PATENT DOCUMENTS

| 3,736,590 | 5/1973 | Lipsey et al. | 343/103 |
|---|---|---|---|
| 3,913,028 | 10/1975 | Bosselaers | 331/1 A |
| 4,144,489 | 3/1979 | Ward et al. | 331/1 A |
| 4,229,822 | 10/1980 | Bench | 375/120 |
| 4,231,091 | 10/1980 | Motz | 364/569 |
| 4,276,512 | 6/1981 | Wittke | 328/155 |
| 4,305,045 | 12/1981 | Metz et al. | 331/1 A |
| 4,307,346 | 12/1981 | Kurosawa et al. | 328/155 |

Primary Examiner—John S. Heyman

[57] ABSTRACT

A digital phase-locked loop consisting of a digital phase detector for detecting the phase differences between the output and the input frequency signals, a microprocessor programmed to perform both the functions of the loop filter and the phase shifter, and a binary rate multiplier to perform the function of voltage-to-frequency conversion is disclosed. A more precise frequency resolution is obtained by use of the binary rate multiplier and a further reduction in circuit complexity is achieved by removal of the phase shifter circuit in favor of the microprocessor programming.

4 Claims, 7 Drawing Figures

DIGITAL PHASE-LOCKED LOOP CIRCUIT

BACKGROUND OF THE INVENTION

This invention relates to phase-locked loop circuits. More particularly, the invention relates to a digital phase-locked loop circuit for locking an output frequency both as to its frequency and its phase to an input frequency signal.

Phase-locked loop circuits have found wide application in the prior art. Control systems, navigation systems, radar, telemetry tracking and communications receivers and bit synchronizers all employ various forms of phase-locked loops to improve performance and enhance capability. Modern electronic technology (e.g. microprocessors and large-scale-integrated-circuits (LSI)) have enabled more exotic embodiments of this basic electronic circuit, including digital approaches. However, digital embodiments of phase-locked loops, such as that disclosed in U.S. Pat. No. 3,736,590, suffer from several disadvantages. Even with the use of LSI circuits, the basic circuit is quite complex, requiring a large number of components to implement the phase-locked loop functions, i.e., loop filter, voltage-to-frequency conversion, phase detection, etc. Accordingly, circuit susceptibility to temperature drifts, circuit reliability, cost to manufacture, and other problems result.

As disclosed in U.S. Pat. No. 3,736,590, the voltage-to-frequency function of the phase locked loop is accomplished through the use of a programmable divider circuit where the desired output frequency is programmed from a microprocessor. The output frequency is then phase shifted to obtain the phase-locked output frequency signal. This phase shift function also must be programmed from the microprocessor. Where a fine resolution in both frequency generation and phase shifting is required, the programmable divider approach simply is not adequate. The resolution of the programmable divider approach is controlled by the time interval of one clock cycle of the clocking signal to the programmable divider. One bit of the programming code being equivalent to one clock cycle time resolution between output pulses of the programmable divider. Applications requiring a higher degree of resolution in the frequency and phase lock of the output frequency signal for the same number of programming bits from the microprocessor require finer control of the voltage-to-frequency function than can be achieved through the use of a programmable divider. Additionally, the phase shift function requires several circuit components which suffer from the aforesaid disadvantages, and adds to the phase locking instability of the loop due to short term phase shift jitter.

Because of the limitations present in the prior art, it would be advantageous to provide a digital phase locked loop circuit which provides a high degree of phase and frequency resolution to accurately phase lock the output to the input. It would also be advantageous to eliminate the need for a discrete component implementation of the phase shift function thereby to remove a large number of components required to implement the phase locked loop circuit and to remove the phase inaccuracies due therefrom.

SUMMARY OF THE INVENTION

In accordance with the present invention, a digital phase-locked loop for controlling an output digital frequency signal to track both the phase and the frequency of an input digital frequency signal is disclosed. The phase locked loop includes a phase detector that responds to both the input and the output frequency signals for detecting the phase difference therebetween. A microprocessor responds to the output of the phase detector to generate a frequency select code that represents the frequency of the output frequency signal. The generation of the frequency select code includes a phase shift correction derived from the phase error and a frequency shift correction also derived from the phase error.

Also included in the phase-locked loop is a binary rate multiplier that responds to the frequency select code from the microprocessor to generate the desired output frequency signal. Included in the binary rate multiplier is a divider circuit for dividing the frequency signal, which is 256 times the resulting output frequency. A crystal controlled oscillator is used as the time base to clock the binary rate multiplier. Both the input and the output of the divider circuit is fed back to the input of the phase detector, the output of the divider being the output frequency of the phase-locked loop and the input being the clocking frequency to the phase detector for use in generating the phase difference. The frequency select code generated by the microprocessor controls the frequency of the output frequency signal to cause the phase difference detected by the phase detector to approach zero. At zero, the output frequency signal is equal in phase and frequency to the input frequency signal.

BRIEF DESCRIPTION OF THE DRAWINGS

For a fuller understanding of the present invention, reference should be had to the following detailed description taken in connection with the accompanying drawings, in which.

Similar reference characters refer to similar parts throughout the several views of the drawings.

DETAILED DESCRIPTION OF THE PREFERRED EMBODIMENT

Figure 1:
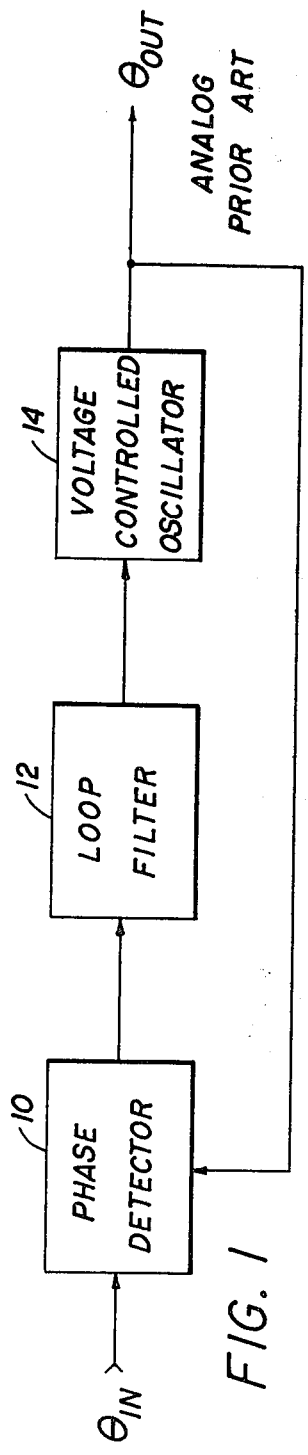
FIG. 1 is a block diagram of an analog prior-art phase-locked loop circuit.
Figure 4:
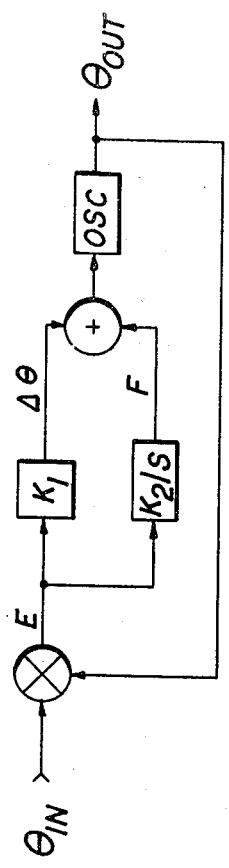
FIG. 4 is a block diagram of the mathematical equivalent to the analog prior-art phase-locked loop as shown in FIG. 1.

Referring first to FIG. 1, a prior-art analog phase-locked loop is shown consisting of a phase detector 10, loop filter 12 and voltage controlled oscillator 14. The loop filter can be of any order (first, second, third, etc.) and determines loop tracking response. Most applications are of the second order employing a position (phase) correction and an integration of position error (frequency) correction. This is indicated mathematically in FIG. 4. Factors K1 and K2 are the gain factors which, in terms of classic phase-locked loop theory, describe loop response and define the natural frequency ($\omega_m$) and damping factor $\zeta$(ZETA). The phase error (E) is multiplied by the phase gain factor (K1) to produce an instaneous phase correction ($\Delta\theta$) which is applied to the oscillator 14. The error (E) is likewise multiplied by the gain factor K2, integrated (indicated by 1/s) and applied as a constant, but variable, frequency correction (f). In the analog phase-locked loop, the loop filter 12 is usually realized as an operational amplifier with discrete resistors and capacitors setting loop gains and frequency responses, and outputs a direct-current voltage to the voltage controlled oscillator 14.

Figure 2:
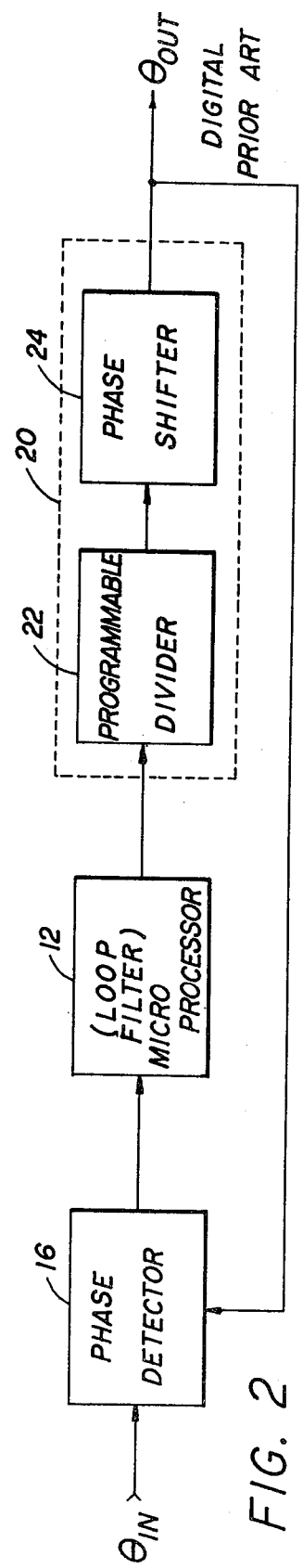
FIG. 2 is a block diagram of a digital prior-art phase-locked loop circuit.

Turning now to FIG. 2, a digital implementation of a phase-locked loop is shown. Microprocessor 12 is capable of accepting the detector error (E), multiplying it as gain values (K1 and K2) and calculating a resulting phase and frequency correction ($\Delta\theta$ and f). The microprocessor 12 outputs a digital code which represents the number of clock cycles of a clocking signal will occur before an output pulse will be produced by the programmable divider 22. Phase shifter 24 then phase shift the output from the divider 22 to produce the output frequency $\theta_{OUT}$. The phase shifter 24 is also under control of the microprocessor 12 as to the amount of phase shift that will be applied.

Figure 3:
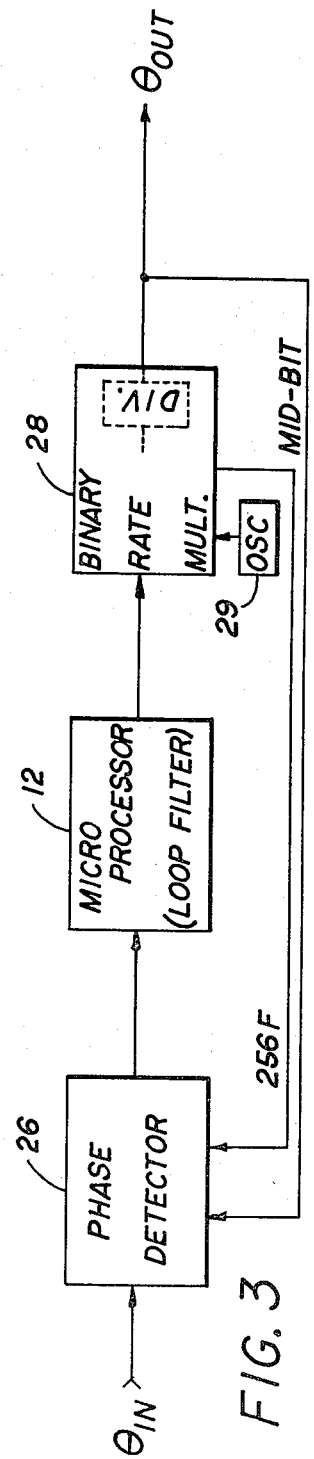
FIG. 3 is a block diagram of a digital phase-locked loop according to the present invention.

Referring now to FIG. 3, a block diagram of the present invention is shown. The digital phase-locked loop according to the invention consists of a phase sensitive detector 26, a microprocessor 12, a binary rate multiplier 26 and crystal controlled oscillator 28. Phase detector 26 is shown responding to the input frequency signal $\theta_{IN}$, the output frequency signal $\theta_{OUT}$ and a clocking frequency 256f, where f is the frequency of the output signal $\theta_{OUT}$. In other words, the binary rate multiplier is operated at a frequency 256 times the operating frequency of the phase-locked loop. Microprocessor 12 may be any standard microprocessor having sufficient execution speeds to execute a program according to the flow diagram of the programming of the preferred embodiment of the invention as shown in FIG. 7. For the preferred embodiment of the invention, the binary rate multiplier 26 is constructed from individual binary rate multiplier units manufactured by Texas Instruments as their model SN 7497.

A binary rate multiplier is a large scale digital integrated microcircuit designed to produce a quasi-symmetrical pulse train, of varying frequency, from a standard crystal frequency. Cascading of independent rate multiplier stages provides for increasing precision of frequency and may be controlled by a digital input indicative of the frequency desired. Each rate multiplier unit of the preferred embodiment consists of a four-state binary counter with appropriate gates. The maximum number of output pulses for sixteen input pulses is fifteen. This provides the sixteenth interval for cascaded stages to add up to fifteen pulses in this blank time period, and so forth for following stages. The pulses are selected such that reasonable time symmetry exists for each possible combination. Thus, it can be stated, that for a given crystal input frequency any given frequency may be selected up to the precision of the cascaded rate multiplier stages, permitting digital synthesis equivalent to the analog control of a voltage-controlled-oscillator.

Control of the binary rate multiplier is developed within the microprocessor 12 which performs the function of the loop filter in a classic phase-locked loop. The present invention takes advantage of the time-frequency interrelationship between the period of a digital frequency signal and its frequency. This permits a phase error (time) to be converted into a frequency correction (f). This conversion of the phase error (E), derived from the detector 26, to a frequency control function for the rate multiplier 26 relies on the expression:

$$T + \Delta T = \frac{1}{F + \Delta F} \quad (1)$$

where:
T = Period or 360° phase
$\Delta T$ = Change of period or phase error/correction
F = Frequency
$\Delta F$ = Frequency error/correction
Mathematically, the equation to derive a frequency correction in terms of period and phase error is:

$$1 = (T+\Delta T)(F+\Delta F) \quad (2)$$

$$1 = (FT + F\Delta T + \Delta F(T + \Delta T)) \quad (3)$$

Since FT = 1:

$$0 = F\Delta T + \Delta F (T + \Delta T) \quad (4)$$

$$\Delta F \ (T + \Delta T) = -F\Delta T \quad (5)$$

$$\Delta F = -F\left(\frac{\Delta T}{T + \Delta T}\right) \quad (6)$$

For small error $T+\Delta T \approx 1$ and the expression can be simplified to:

$$\Delta F \approx -F \frac{\Delta T}{T} \quad (7)$$

Where $\Delta T/T$ is equivalent to phase error, multiplication of phase error by F (operating frequency) is the factor which makes loop operation frequency transparent. Programming microprocessor 12 according to the mathematical model shown in FIG. 5 which is in accordance with equation (7), the loop filter function and the phase shift function can both be accomplished at the same time.

Figure 5:
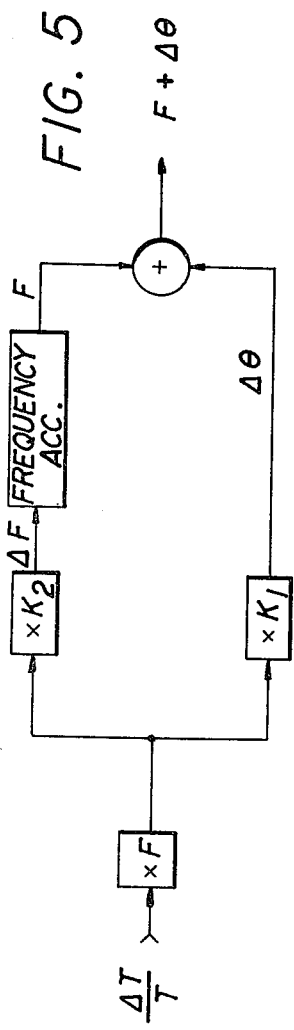
FIG. 5 is a block diagram representation of a mathematical equivalency to the function performed by the microprocessor of the present invention.

Referring to FIG. 5, the detected phase error (E) is input to the microprocessor 12 which in the description of the detector 26 (see FIG. 6), will be shown to be the equivalent of $\Delta T/T$. This value is multiplied by F (the operating frequency stored in the frequency accumulator) and then multiplexed and multiplied by the gain values, K1 (to obtain $\Delta\theta$) and K2 (to obtain $\Delta f$). The frequency error increment ($\Delta F$) is then added to the frequency accumulator, which functions as an integrator, and the resulting value is the corrected frequency (f). The phase correction ($\Delta\theta$), converted to an instantaneous frequency correction, is added to this value and results in the interval-by-interval frequency selection for the binary rate multiplier. Each interval constitutes one clock cycle of the input frequency signal $\theta_{IN}$. It should be noted that the phase correction is an interval-by-interval correction and although converted to frequency, the correction is, in fact, an interval phase correction.

One basic application of the universal binary rate multiplier phase locked loop according to the invention is a variable-rate bit synchronizer. This use employs a random information stream of marks and spaces or "1"

and "0" for $\theta_{IN}$ such that no apriori knowledge of character transitions exists, only the approximate rate of transmission. This then requires detection of transitions and conversion of time displacement error to linear phase error. This detection process is indicated in FIG. 6.

Figure 6:
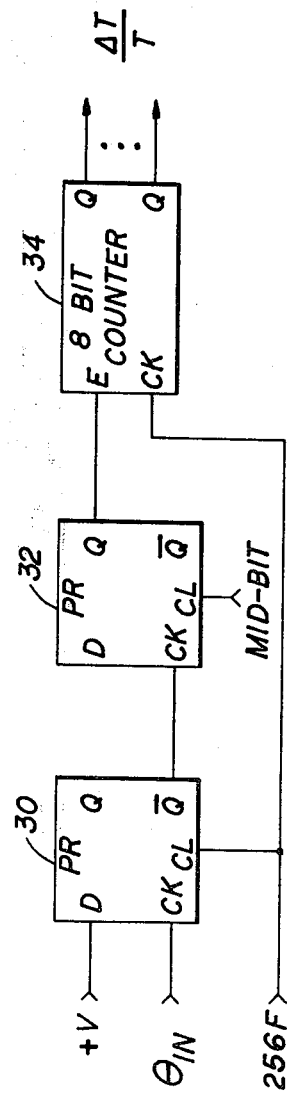
FIG. 6 is a circuit diagram of one embodiment of the phase detector illustrated in FIG. 3.

Referring to FIG. 6, the quasi-square wave input $\theta_{IN}$ is used as the clock input to a "D" type flip-flop 30. Clocking is either positive or negative transitions and is reset by 256 times the operating frequency (256f). This provides a narrow clock pulse for the counter-enable flip-flop 32, which is clocked "on" at the choosen polarity of transitions in $\theta_{IN}$. Flip-flop 32 enables the linear detector 34, an 8-bit counter. Counter 34 will count until MID-BIT or half-cycle time of the phase-locked loop operating frequency $\theta_{OUT}$. This mid-bit pulse resets the counter enable flip-flop 32 to remove the count enable to counter 34. The state of the counter 34 is then representative of the accuracy of phase lock. When the loop is exactly synchronized to the incoming bit-stream, the mid-bit time will occur at 128 counts or 1000 0000. An error of 1.4° in either direction (360°÷256) will give a count of 1000 0001 or 0111 1111. Thus it can be seen that the most significant bit is the sign of the error and the lesser significant bits are the magnitude. With the least significant bit having a weight of 1.4°, the error (E) can be calculated by the microprocessor based on this weighted binary count.

In order to provide higher weighted outputs, the binary rate multiplier 26 actually operates at a much higher frequency and is divided down to the operating frequency $\theta_{OUT}$. This also has the effect of reducing the phase jitter which is inherent in binary rate multipliers.

The foregoing description of the invention has been directed to a particular preferred embodiment in accordance with the requirements of the Patent Statutes, and for purposes of explanation and illustration. It will be apparent, however, to those skilled in this art that many modifications and changes may be made in the circuit without departing from the scope and spirit of the invention. These, and other modification of the invention will be apparent to those skilled in this art. It is the applicant's intention in the following claims to cover all such equivalent modifications and variations as fall within the true spirit and scope of the invention.

What is claimed is:

1. A digital phase-locked loop for controlling a digital output signal having time periods to track both as to its frequency and its phase a digital input signal having successive time intervals which defines a transmission frequency for said input signal, said input signal being in one of two possible logic states in each time interval, comprising:
    (a) a phase detector responsive to said input and output signals, for detecting in the time intervals the phase difference therebetween;
    (b) a microprocessor responsive to the detected phase differences for generating for each interval a frequency select code to control the frequency of said output signal, the frequency select code for each interval including a phase shift correction component generated only from the measured phase difference for that interval if a phase difference measurement is obtained and a frequency correction component generated from all the measured phase differences; and
    (c) a binary rate multiplier responsive to the frequencies select code, for generating said output signal, the frequency select codes generated by said microprocessor controlling the frequency of said output signal on an interval-by-interval basis to cause the phase difference detected in successive intervals by said phase detector to approximate zero thereby locking the phase and frequency of said output signal to the phase and transmission frequency of said input signal.

2. The digital phase-locked loop of claim 1 wherein said phased detector comprises:
    (a) a logic state transition detector responsive to said digital input signal for detecting the start of a time interval, said detector outputting a counter enable signal when the start of a time interval is detected; and
    (b) a binary counter responsive to said digital output signal and said counter enable signal for counting clock pulses derived from said digital output signal, said detector terminating said counter enable signal at the mid-point of the time period of said output signal to obtain a count in said counter representative of the phase error between said digital input signal and said digital output signal.

3. The digital phase-locked loop of claim 2 wherein said detector comprises:
    (a) a first flip-flop responsive to said digital input and output signals, said first flip-flop generating a clocking pulse when a specific logic transition occurs at the start of a time interval; and
    (b) a second flip-flop for generating said counter enable signal in response to the clocking pulse from said first flip-flop, said second flip-flop cleared at the mid-point of the time period of said output signal thereby terminating said counter enable signal.

4. The phase-locked loop of claim 1 wherein said microprocessor includes a frequency accumulator means for accumulating, on an interval-by-interval basis, said frequency correction component, the contents of said accumulator means representing the integration of the frequency corrections from all of the measured phased differences, said microprocessor generating the frequency select code for each time interval by summing the frequency correction component in said accumulator means with said phase shift correction component derived from the phase difference measured for that interval, said microprocessor outputting the frequency correction component as said frequency select code if a phase difference measurement is not taken for that interval.

* * * * *

UNITED STATES PATENT AND TRADEMARK OFFICE
CERTIFICATE OF CORRECTION

PATENT NO. : 4,418,318
DATED : Nov. 29, 1983
INVENTOR(S) : Arnold Swagerty, et al.

Figure 7A:
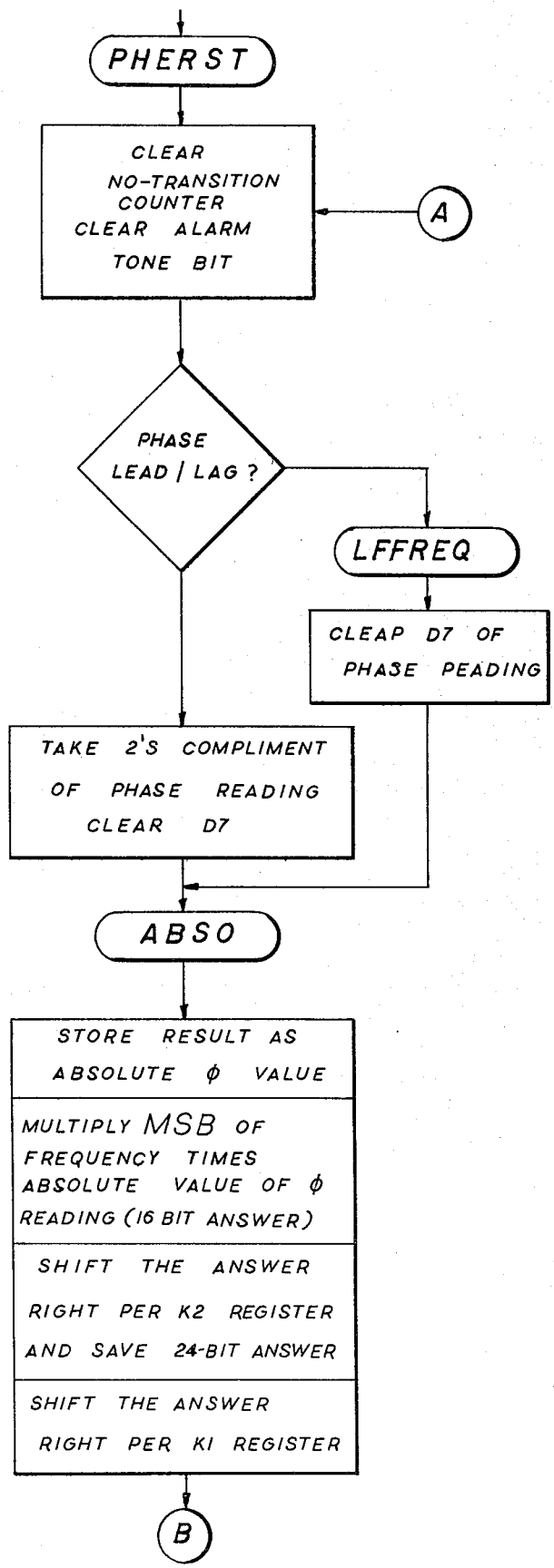
FIG. 7 is a computer flow diagram of the programming of the microprocessor as shown in FIG. 3.
Figure 7B:
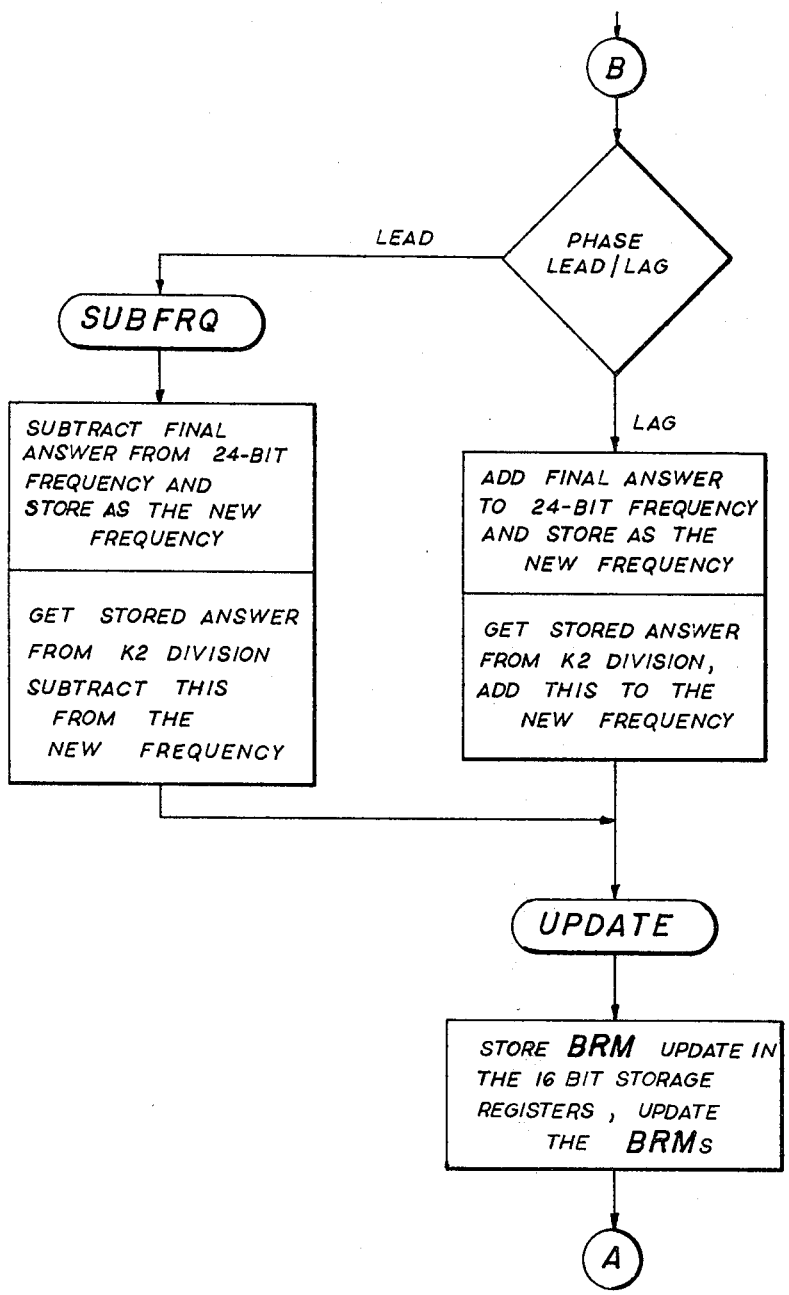

It is certified that error appears in the above—identified patent and that said Letters Patent is hereby corrected as shown below:

Column 2, line 53, delete "FIG. 7" and insert --FIGS. 7A and 7B together form--.

Column 3, line 5, delete "instaneous" and insert --instantaneous--.

Column 3, line 31, delete "28" and insert --29--.

line 31, delete "26" and insert --28--.

line 42, delete FIG. 7" and insert --FIGS. 7A and 7B -- line 43, delete "26" and insert --28--.

Column 4, line 6, delete "26" and insert --28--.

Column 5, line 30, delete "26" and insert --28--.

Signed and Sealed this

Third Day of July 1984

[SEAL]

Attest:

GERALD J. MOSSINGHOFF

*Attesting Officer*  *Commissioner of Patents and Trademarks*